United States Patent
Takaya et al.

(10) Patent No.: US 9,853,139 B2
(45) Date of Patent: Dec. 26, 2017

(54) SEMICONDUCTOR DEVICE AND METHOD FOR MANUFACTURING THE SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Hidefumi Takaya, Toyota (JP); Jun Saito, Toyota (JP); Akitaka Soeno, Toyota (JP); Toshimasa Yamamoto, Ichinomiya (JP); Narumasa Soejima, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/124,326

(22) PCT Filed: Feb. 10, 2015

(86) PCT No.: PCT/JP2015/053693
§ 371 (c)(1),
(2) Date: Sep. 7, 2016

(87) PCT Pub. No.: WO2015/156024
PCT Pub. Date: Oct. 15, 2015

(65) Prior Publication Data
US 2017/0018643 A1 Jan. 19, 2017

(30) Foreign Application Priority Data
Apr. 9, 2014 (JP) .................................. 2014-080012

(51) Int. Cl.
*H01L 29/78* (2006.01)
*H01L 29/06* (2006.01)
(Continued)

(52) U.S. Cl.
CPC ........ *H01L 29/7811* (2013.01); *H01L 21/761* (2013.01); *H01L 29/06* (2013.01);
(Continued)

(58) Field of Classification Search
CPC . H01L 29/78; H01L 29/7811; H01L 29/0623; H01L 29/0661
See application file for complete search history.

(56) References Cited

U.S. PATENT DOCUMENTS

2002/0185705 A1 12/2002 Saitoh et al.
2010/0224932 A1* 9/2010 Takaya ................ H01L 29/0623
257/330
(Continued)

FOREIGN PATENT DOCUMENTS

EP 0 813 250 A2 12/1997
JP H10-70271 A 3/1998
(Continued)

*Primary Examiner* — Phuc Dang
(74) *Attorney, Agent, or Firm* — Oliff PLC

(57) ABSTRACT

A semiconductor device provided herein includes: a fourth region of a p-type being in contact with a lower end of the gate trench; a termination trench provided in the front surface in a range outside the second region; a lower end p-type region of the p-type being in contact with a lower end of the termination trench; a lateral p-type region of the p-type being in contact with a lateral surface of the termination trench on an outer circumferential side, connected to the lower end p-type region, and exposed on the front surface; and a plurality of guard ring regions provided on the outer circumferential side with respect to the lateral p-type region and exposed on the front surface.

6 Claims, 11 Drawing Sheets

(51) Int. Cl.
- H01L 29/12 (2006.01)
- H01L 21/761 (2006.01)
- H01L 29/10 (2006.01)
- H01L 29/40 (2006.01)
- H01L 29/66 (2006.01)
- H01L 29/423 (2006.01)

(52) U.S. Cl.
CPC ...... H01L 29/0623 (2013.01); H01L 29/0661 (2013.01); H01L 29/0696 (2013.01); H01L 29/1095 (2013.01); H01L 29/12 (2013.01); H01L 29/408 (2013.01); H01L 29/4236 (2013.01); H01L 29/66734 (2013.01); H01L 29/7813 (2013.01)

(56) References Cited

U.S. PATENT DOCUMENTS

| | | | | |
|---|---|---|---|---|
| 2012/0037954 | A1* | 2/2012 | Hshieh | H01L 29/0638 257/139 |
| 2013/0099251 | A1 | 4/2013 | Hiyoshi et al. | |
| 2013/0334598 | A1* | 12/2013 | Okumura | H01L 29/0607 257/335 |
| 2014/0042530 | A1 | 2/2014 | Cho et al. | |
| 2014/0339600 | A1* | 11/2014 | Yoshikawa | H01L 29/36 257/139 |
| 2015/0129895 | A1 | 5/2015 | Takeuchi et al. | |
| 2015/0137220 | A1* | 5/2015 | Li | H01L 21/76802 257/330 |
| 2015/0162423 | A1* | 6/2015 | Lee | H01L 21/265 257/139 |
| 2016/0126306 | A1* | 5/2016 | Sdrulla | H01L 29/0626 257/77 |

FOREIGN PATENT DOCUMENTS

| | | |
|---|---|---|
| JP | 2002-368216 A | 12/2002 |
| JP | 2013-191734 A | 9/2013 |
| JP | 2013-258369 A | 12/2013 |
| JP | 2014-039030 A | 2/2014 |
| WO | 2013/058037 A1 | 4/2013 |

* cited by examiner

SEMICONDUCTOR DEVICE AND METHOD FOR MANUFACTURING THE SEMICONDUCTOR DEVICE

CROSS-REFERENCE TO RELATED APPLICATION

The present application is related to, and claims priority based on, Japanese Patent Application No. 2014-080012 filed on Apr. 9, 2014. The entire contents described in this Japanese patent application are hereby incorporated by reference as components of the present specification.

TECHNICAL FIELD

The art disclosed herein relates to a semiconductor device.

BACKGROUND ART

A semiconductor device disclosed in Japanese Patent Application Publication No, 2013-191734 has a MOSFET, and a plurality of termination trenches provided around the circumference of the MOSFET. Each of the termination trenches extends annularly so as to surround a region where the MOSFET is provided. Each of the termination trenches has an insulating layer disposed therein. Moreover, provided in a range of a semiconductor layer that is in contact with a bottom surface of each of the termination trenches is a p-type floating region. When the MOSFET is turned off, a depletion layer extends from a body region of the MOSFET toward an outer circumferential side (a region where the termination trenches are provided). When the depletion layer extends to the p-type floating region on a lower side of the innermost termination trench, the depletion layer further extends from that p-type floating region toward the outer circumferential side. When the depletion layer thereby extends to the next p-type floating region, the depletion layer further extends from that p-type floating region toward the outer circumferential side. As such, the depletion layer spreads widely, through each of the p-type floating regions, around the circumference of the region where the MOSFET is provided. The semiconductor device thereby achieves an improved withstand voltage.

SUMMARY

Technical Problem

In recent years, the demand for a withstand voltage in semiconductor devices of the above-mentioned type has been escalating. Conventionally, the above-mentioned p-type floating region is formed by initially forming the termination trench, and then implanting p-type impurities into the bottom surface of the termination trench, and afterwards allowing the p-type impurities thus implanted to diffuse in the semiconductor layer. However, depending on material of the semiconductor or various conditions of other manufacturing steps, there may be a case where a distance over which the p-type impurities diffuse becomes short, causing a failure to sufficiently narrow a spacing between every two of the p-type floating regions. In such a case, it becomes difficult to sufficiently expand the depletion layer in a region of that spacing. It can also be considered that a spacing between every two of the termination trenches is narrowed to thereby narrow the spacing between every two of the p-type floating regions. However, owing to the problem associated with processing accuracy and others, narrowing the spacing between every two of the termination trenches has its own limitations. In the structure of a conventional termination trench, improvement in withstand voltage has been limited. Accordingly, the present teachings disclose a semiconductor device capable of realizing a much higher withstand voltage.

Solution to Technical Problem

The present disclosure provides a semiconductor device comprising a semiconductor substrate, a front electrode provided on a front surface of the semiconductor substrate, and a rear electrode provided on a rear surface of the semiconductor substrate. The semiconductor device is configured to switch a conducting path between the front electrode and the rear electrode. The semiconductor substrate comprises: a first region of an n-type being in contact with the front electrode; a second region of a p-type being in contact with the front electrode and the first region; a third region of the p-type provided on a lower side of the second region and separated from the first region by the second region; a gate trench provided in the front surface and penetrating the first region and the second region so as to reach the third region; a fourth region of the p-type being in contact with a lower end of the gate trench; a termination trench provided in the front surface in a range outside the second region; a lower end p-type region of the p-type being in contact with a lower end of the termination trench; a lateral p-type region of the p-type being in contact with a lateral surface of the termination trench on an outer circumferential side, connected to the lower end p-type region, and exposed on the front surface; a plurality of guard ring regions provided on the outer circumferential side with respect to the lateral p-type region and exposed on the front surface; and an outer circumference n-type region of the n-type provided on the outer circumferential side with respect to the termination trench, connected to the third region, separating the lateral p-type region from the guard ring regions, and separating the guard ring regions from one another.

Notably, in the present specification, the outer circumferential side refers to a side farther from the second region.

In this semiconductor device, a switching element is formed with the first, second, third, and fourth regions. When the switching element is turned off, a depletion layer spreads from the second region into the third region. When the depletion layer reaches the lower end of the gate trench, the depletion layer reaches the fourth region. Consequently, the depletion layer also spreads from the fourth region into the third region. The withstand voltage in a region where the switching element is provided is thereby ensured. Moreover, when the depletion layer that spreads from the second region into the third region reaches the lower end of the termination trench, the depletion layer reaches the lower end p-type region. Consequently, the depletion layer spreads from the lower end p-type region and the lateral p-type region into the outer circumference n-type region. When the depletion layer that spreads from the lateral p-type region reaches the guard ring region next to the lateral p-type region, the depletion layer further spreads from that guard ring region to the guard ring region next thereto. The depletion layer spreads toward the outer circumferential side through each of the guard ring regions. The depletion layer thereby widely expands in a region on the outer circumferential side, and the withstand voltage is ensured. As such, in this semiconductor device, expansion of the depletion layer can be promoted by the guard rings exposed on the front surface of the semiconductor substrate. Moreover, each of the guard ring regions is provided in a range exposed on the front surface of the semiconductor substrate, and hence can be provided with high accuracy. The spacing between the guard ring regions can thereby be narrowed easily. In this semiconductor device, sufficient withstand voltage can therefore be ensured by the guard ring regions.

DESCRIPTION OF EMBODIMENTS

Some of preferred features of embodiments described below will hereinafter be listed. Notably, the features below have usefulness independently.

(Feature 1) A width of the termination trench may be wider than a width of the gate trench.

(Feature 2) The lower end p-type region and the lateral p-type region may include Al.

(Feature 3) A separation trench may be provided in the front surface of the semiconductor substrate between the second region (body region 26) and the termination trench. A fifth region (p-type floating region 103) of the p-type may be provided in a position being in contact with a lower end of the separation trench. A sixth region (lateral p-type region 108) of the p-type may be provided between the termination trench and the separation trench. The sixth region may be in contact with a lateral surface of the termination trench on an inner circumference side, connected to the lower end p-type region, and exposed on the front surface of the semiconductor substrate. The separation trench may separate the second region from the sixth region. Notably, in the present specification, the inner circumferential side refers to a side closer to the second region.

(Feature 4) The termination trench may comprise a first trench, a second trench provided on the outer circumference side with respect to the first trench, and a third trench connecting the first trench and the second trench. The lateral p-type region may be in contact with a lateral surface of the second trench on the outer circumference side. The lower end p-type region may be in contact with lower ends of the first, second, and third trenches.

(Feature 5) The semiconductor device may further comprise an insulating film covering a lateral surface on an inner circumference side, a bottom surface, and the lateral surface on the outer circumference side of the termination trench. A region in which the insulating film is not provided may be provided between a portion of the insulating film covering the lateral surface on the inner circumference side and a portion of the insulating film covering the lateral surface on the outer circumference side.

(Feature 6) A method for manufacturing the semiconductor device may comprise steps of forming the termination, trench in the semiconductor substrate; and forming the lower end p-type region and the lateral p-type region by implanting p-type impurities into the lateral surface and a bottom surface of the termination trench along a direction inclined to the front surface of the semiconductor substrate.

First Embodiment

Figure 1:
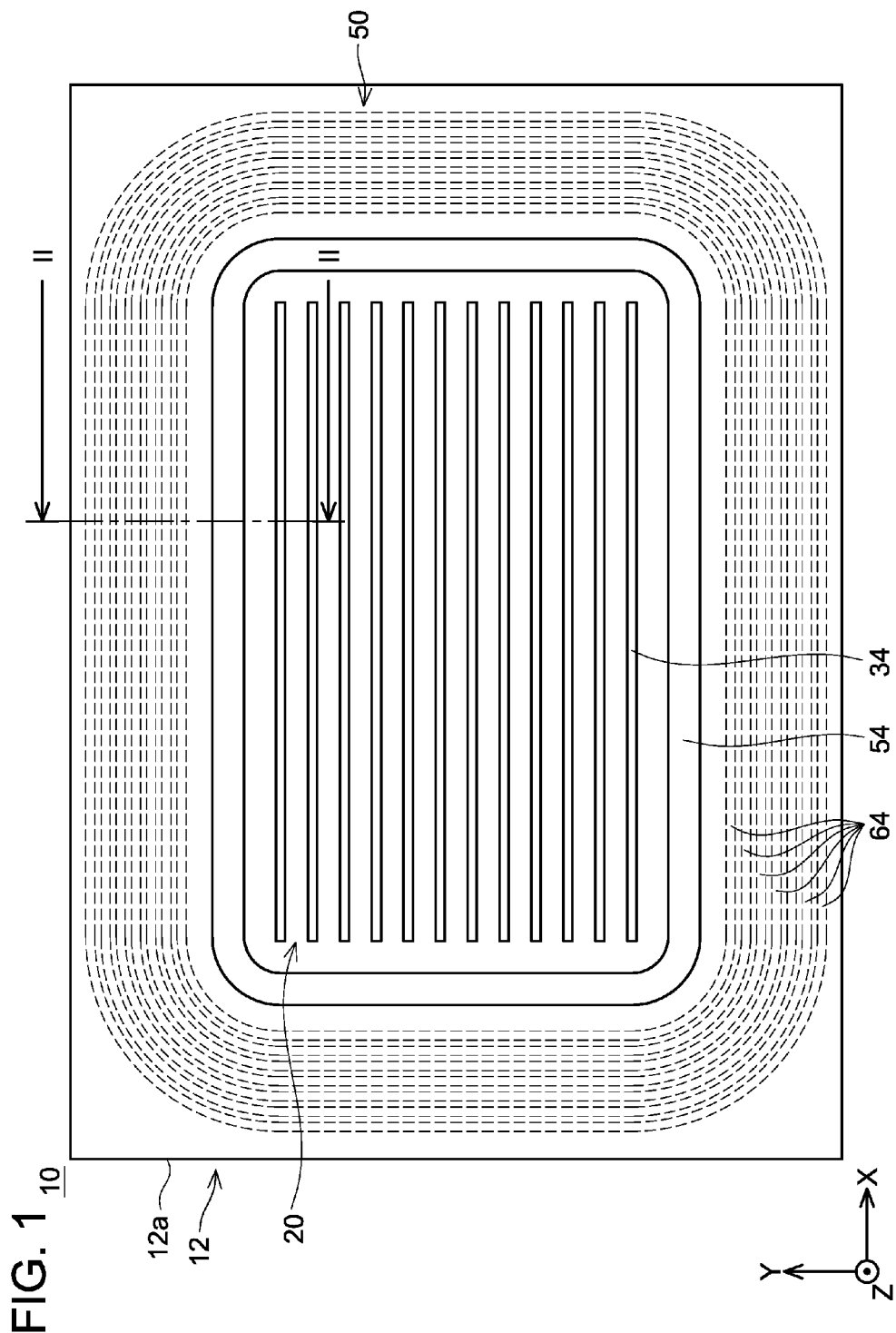
FIG. 1 is a plan view of a semiconductor device 10 in a first embodiment.

As shown in FIG. 1, a semiconductor device 10 according to a first embodiment has a semiconductor substrate 12 constituted of SIC (silicon carbide). The semiconductor substrate 12 has a MOSFET region 20 and an outer circumference region 50. The MOSFET region 20 has a MOSFET provided therein. Notably, in FIG. 1, only gate trenches 34 are shown in the MOSFET region 20, with consideration for visibility of the drawing. The outer circumference region 50 is a region outside the MOSFET region 20. In the present embodiment, the outer circumference region 50 is a region between the MOSFET region 20 and an end surface 12a of the semiconductor substrate 12. The outer circumference region 50 has a withstand voltage structure provided therein. Notably, in FIG. 1, only atermination trench 54 and guard ring regions 64 are shown in the outer circumference region 50, with consideration for visibility of the drawing.

Figure 2:
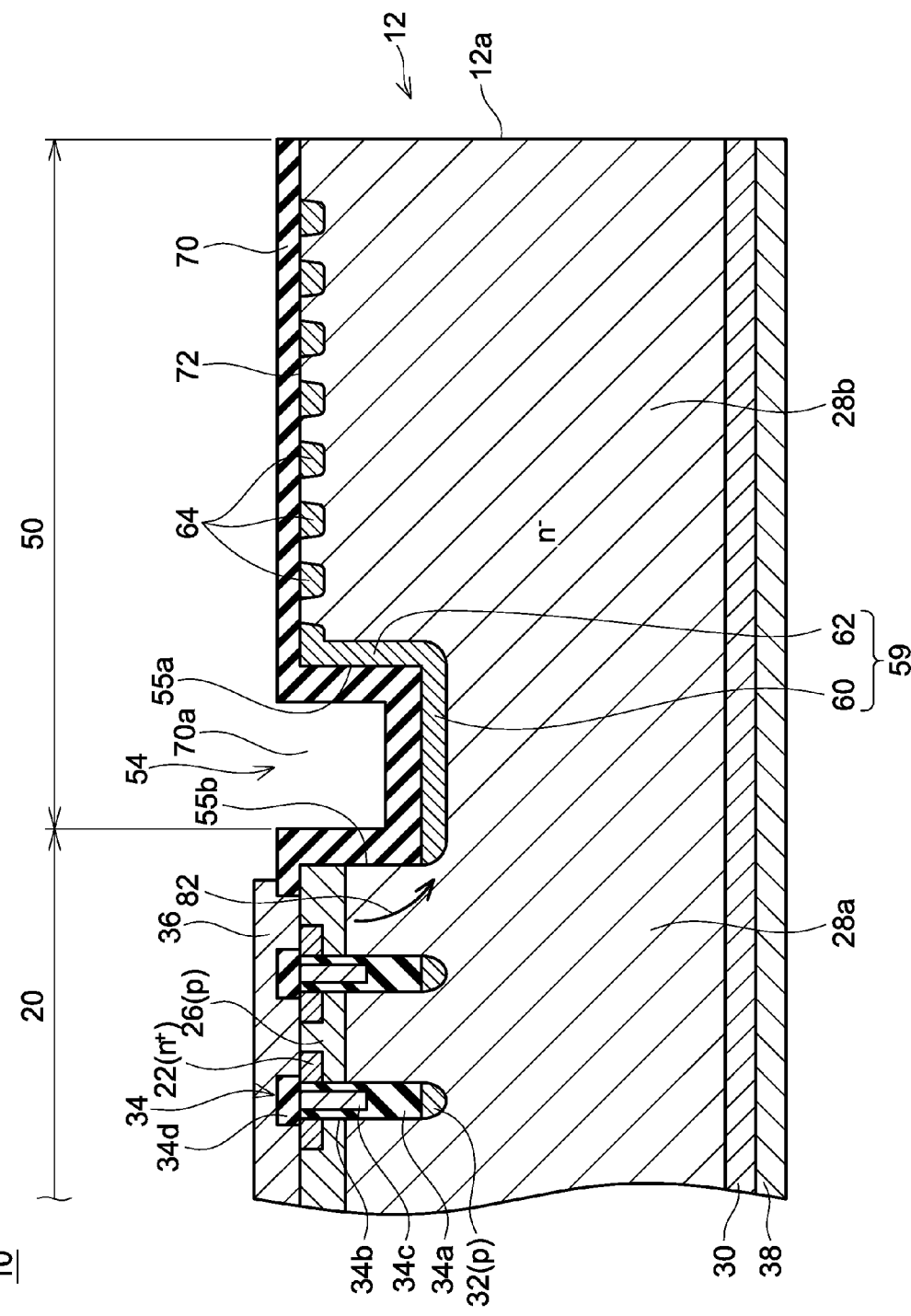
FIG. 2 is a vertical cross-sectional view taken along a line II-II in FIG. 1.

As shown in FIG. 2, provided in the MOSFET region 20 are source regions 22, a body region 26, a drift region 28a, a drain region 30, p-type floating regions 32, the gate trenches 34, a source electrode 36, and a drain electrode 38.

The source electrode 36 is provided on an upper surface 72 of the semiconductor substrate 12 in the MOSFET region 20.

The drain electrode 38 is provided on a lower surface of the semiconductor substrate 12.

A plurality of the source regions 22 is provided in the MOSFET region 20. Each of the source regions 22 is an n-type region that includes n-type impurities in a high concentration. The source region 22 is provided in a range exposed on the upper surface of the semiconductor substrate 12. The source region 22 is in conduction with the source electrode 36.

The body region 26 is provided on a lateral side and a lower side of the source region 22, and in contact with the source region 22. The body region 26 is a p-type region. The body region 26 is exposed on the upper surface of the semiconductor substrate 12, at positions where the source regions 22 are not provided. The body region 26 is in conduction with the source electrode 36.

The drift region 28a is an n-type region that includes n-type impurities in a low concentration. The drift region 28a has an n-type impurity concentration lower than the n-type impurity concentration of the source regions 22. The drift region 28a is provided on a lower side of the body region 26. The drift region 28a is in contact with the body region 26, and separated from the source regions 22 by the body region 26.

The drain region 30 is an n-type region that includes n-type impurities in a high concentration. The drain region 30 has an n-type impurity concentration higher than the n-type impurity concentration of the drift region 28a. The drain region 30 is provided on a lower side of the drift region 28a. The drain region 30 is in contact with the drift region 28a, and separated from the body region 26 by the drift region 28a. The drain region 30 is provided in a range exposed on the lower surface of the semiconductor substrate 12. The drain region 30 is in conduction with the drain electrode 38.

A plurality of the gate trenches 34 is provided in the MOSFET region 20. Each of the gate trenches 34 is a groove provided in the upper surface 72 of the semiconductor substrate 12. Each of the gate trenches 34 penetrates the source region 22 and the body region 26 so as to reach the drift region 28. As shown in FIG. 1, the plurality of the gate trenches 34 extend in parallel with one another. As shown in FIG. 2, each of the gate trenches 34 has a bottom insulating layer 34a, a gate insulating film 34b, and a gate electrode 34c provided therein. The bottom insulating layer 34a is a thick insulating layer provided at a bottom portion of the gate trench 34. A lateral surface of the gate trench 34 on an upper side of the bottom insulating layer 34a is covered with the gate insulating film 34b. The gate trench 34 on the upper side of the bottom insulating layer 34a has the gate electrode 34c provided therein. The gate electrode 34c faces the source region 22, the body region 26, and the drift region 28a via the gate insulating film 34b. The gate electrode 34c is insulated from the semiconductor substrate 12 by the gate insulating film 34b and the bottom insulating layer 34a. An upper surface of the gate electrode 34c is covered with an insulating layer 34d.

Each of the p-type floating regions 32 is provided in the semiconductor substrate 12, in a range that is in contact with a bottom surface (i.e., a lower end) of the corresponding gate trench 34. The circumference of the p-type floating region 32 is surrounded by the drift region 28. The p-type floating regions 32 are separated from one another by the drift region 28. Moreover, each of the p-type floating regions 32 is separated from the body region 26 by the drift region 28.

A drift region 28b is provided in the outer circumference region 50. The drift region 28b is an n-type region contiguous with the drift region 28a, and has approximately the same n-type impurity concentration as that of the drift region 28a. There may hereinafter be a case where the drift regions 28a and 28b are collectively referred to as a drift region 28. On a lower side of the drift region 28b, the above-mentioned drain region 30 is provided. In other words, the drift region 28 and the drain region 30 are provided astride the MOSFET region 20 and the outer circumference region 50. The drift region 28 and the drain region 30 extend to the end surface 12a of the semiconductor substrate 12. Moreover, the drain electrode 38 is provided on the entirety of the lower surface of the semiconductor substrate 12 that includes the outer circumference region 50. Moreover, the upper surface 72 of the semiconductor substrate 12 in the outer circumference region 50 is covered with an insulating film 70.

Provided in the front surface 72 of the semiconductor substrate 12 in the outer circumference region 50 is the termination trench 54. A lateral surface 55b on an inner circumferential side, a bottom surface, and a lateral surface 55a on an outer circumferential side of the termination trench 54 are covered with the insulating film 70. It should be noted that the termination trench 54 is not completely filled with the insulating film 70, and a gap (a space) 70a is provided between a portion of the insulating film 70 covering the lateral surface 55b on the inner circumferential side and a portion of the insulating film 70 covering the lateral surface 55a on the outer circumferential side. Notably, the gap 70a may be filled with a substance different from that of the insulating film 70. The termination trench 54 is provided at a position adjacent to the body region 26. The termination trench 54 has approximately the same depth as that of the gate trenches 34. As shown in FIG. 1, the termination trench 54 extends to surround the circumference of the MOSFET region 20 in a planar view of the front surface 72 of the semiconductor substrate 12. Accordingly, the body region 26 is separated, by the termination trench 54, from any of the p-type regions in the outer circumference region 50. As such, the p-type regions located on the outer circumferential side with respect to the termination trench 54 are not in conduction with the source electrode 36, and hence the p-type regions located on the outer circumferential side with respect to the termination trench 54 are not the body region 26. In other words, the termination trench 54 is provided outside the body region 26.

As shown in FIG. 2, provided at a position that is in contact with a lower end (i.e., the bottom surface) of the termination trench 54 is a lower end p-type region 60. Moreover, provided at a position that is in contact with the lateral surface 55a of the termination trench 54 on the outer circumferential side is a lateral p-type region 62. The lateral p-type region 62 extends from the front surface 72 to the lower end p-type region 60. In other words, the lateral p-type region 62 is exposed on the front surface 72, and connected to the lower end p-type region 60. The lower end p-type region 60 and the lateral p-type region 62 are contiguous and configure one p-type region, and hence there may hereinafter be a case where they are collectively referred to as a boundary portion p-type region 59. The boundary portion p-type region 59 includes Al as p-type impurities. The boundary portion p-type region 59 does not include p-type impurities other than Al, except for the ones included at an uncontrollable error level. The boundary portion p-type region 59 is provided, along the termination trench 54, to surround the circumference of the MOSFET region 20. The boundary portion p-type region 59 is separated from the body region 26 by the drift region 28.

Provided on the outer circumferential side with respect to the lateral p-type region 62 is a plurality of the guard ring regions 64. Each of the guard ring regions 64 is a p-type region, and provided in a range exposed on the front surface 72. Each of the guard ring regions 64 is provided only in a shallow range. Accordingly, a lower end of each of the guard ring regions 64 is located on an upper side (on the front surface 72 side) with respect to a lower end of the lateral p-type region 62. Provided on a lower side of each of the guard ring regions 64 is the drift region 28b. Provided between the guard ring region 64 on the innermost circumferential side (on the MOSFET region 20 side) and the lateral p-type region 62 is the drift region 28b. The guard ring region 64 on the innermost circumferential side is separated from the lateral p-type region 62 by the drift region 28b. Moreover, the drift region 28b is provided between every two of the guard ring regions 64. The guard ring regions 64 are separated from one another by the drift region 28b. Each of the guard ring regions 64 includes Al as p-type impurities. Each of the guard ring regions 64 does not include p-type impurities other than Al, except for the ones at an uncontrollable error level.

Next, an operation of the semiconductor device 10 will be described. When the semiconductor device 10 is to be operated, a voltage that makes the drain electrode 38 positive is applied to between the drain electrode 38 and the source electrode 36. Furthermore, a gate on voltage is applied to the gate electrode 34c, to thereby turn on the MOSFET in the MOSFET region 20. In other words, a channel is formed in the body region 26 at a position that faces the gate electrode 34c, and a current flows from the source electrode 36 toward the drain electrode 38 through the source region 22, the channel, the drift region 28, and the drain region 30. When the application of the gate on voltage to the gate electrode 34c is stopped, the channel disappears, and the MOSFET is turned off. When the MOSFET is turned off, a depletion layer spreads from a pn junction at a boundary portion between the body region 26 and the drift region 28, into the drift region 28. When the depletion layer reaches the p-type floating regions 32 in the MOSFET region 20, the depletion layer also spreads from the p-type floating regions 32 into the drift region 28. The drift region 28 between the two p-type floating regions 32 is thereby depleted effectively. Therefore, electric field concentration in the MOSFET region 20 is restrained. The high withstand voltage in the MOSFET region 20 is thereby realized.

Moreover, as shown by an arrow 82 in FIG. 2, the depletion layer that spreads from the above-mentioned pn junction also reaches the boundary portion p-type region 59 on a lower side of the termination trench 54. Consequently, the depletion layer spreads from the boundary portion p-type region 59 into the drift region 28. The drift region 28 between the gate trench 34 and the termination trench 54 is depleted by the depletion layer that spreads from, the p-type floating region 32 on a lower side of the gate trench 34, and the depletion layer that spreads from the boundary portion p-type region 59 on the lower side of the termination trench 54 (i.e., the lower end p-type region 60). At this time, the depth of the gate trench 34 is approximately the same as the depth of the termination trench 54 (i.e., the position of the p-type floating region 32 in the depth direction is approximately equal to the position of the lower end p-type region 60 in the depth direction), and hence an equipotential line extends in the drift region 28 between the gate trench 34 and the termination trench 54 in a lateral direction (in a direction parallel to the front surface 72). The electric field concentration in the periphery of the termination trench 54 is thereby restrained.

Moreover, the boundary portion p-type region 59 spreads from the lower end of the termination trench 54 to the front surface 72 of the semiconductor substrate 12. Therefore, in the periphery of the front surface 72, the depletion layer spreads from the boundary portion p-type region 59 toward the guard ring region 64 on the innermost circumferential side. When the depletion layer reaches the guard ring region 64 on the innermost circumferential side, the depletion layer spreads from that guard ring region 64 to the guard ring region 64 next thereto. As such, the depletion layer spreads successively through each of the guard ring regions 64 to the outer circumferential side. Therefore, the depletion layer widely spreads in the outer circumference region 50. The high withstand voltage in the outer circumference region 50 is thereby realized.

As such, in the semiconductor device 10, the boundary portion p-type region 59 on the lower side of the termination trench 54 is provided at a deep position as with the p-type floating region 32, and hence electric field concentration in the periphery of an outer circumferential end of the MOSFET region 20 is restrained. Moreover, the boundary portion p-type region 59 extends from the bottom surface of the termination trench 54 to the front surface 72 of the semiconductor substrate 12, on the outer circumferential side with respect to the termination trench 54, and hence the depletion layer can reach the guard ring regions 64 each provided only in a shallow range in the periphery of the front surface 72. As a result, spread of the depletion layer in the outer circumference region 50 is promoted by the plurality of the guard ring regions 64. Moreover, the guard ring regions 64 are separated from one another, and hence the potential distribution can be made relatively uniform in the outer circumference region 50. Therefore, the high withstand voltage in the outer circumference region 50 is realized.

Next, a method for manufacturing the semiconductor device 10 will be described. Notably, this manufacturing method is characterized in its step for forming the outer circumference region 50, and hence the step for forming the outer circumference region 50 will hereinafter be described, and the description of a step for forming the MOSFET region 20 will be omitted.

Figure 3:
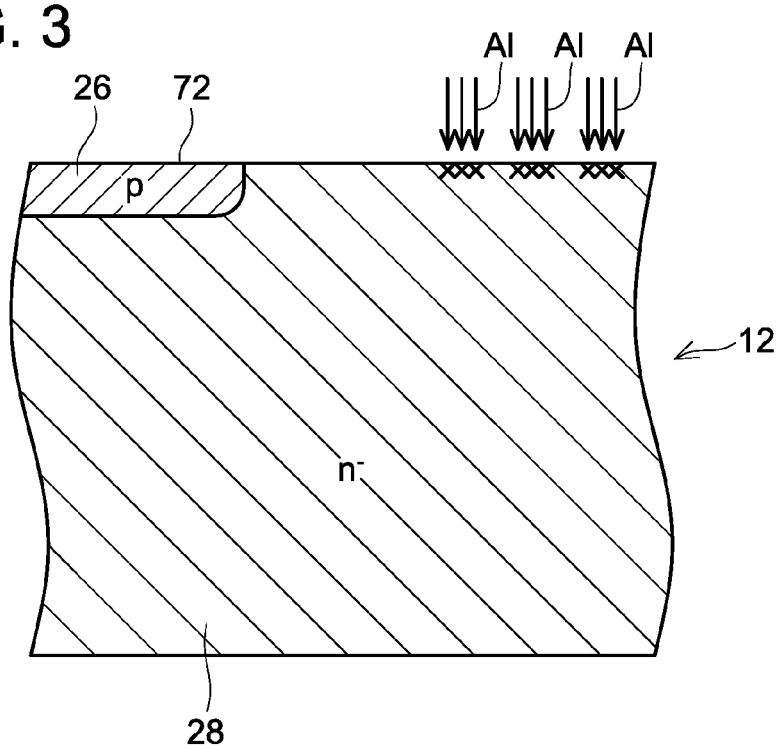
FIG. 3 is an explanatory diagram of a step for manufacturing the semiconductor device 10 in the first embodiment.

Initially, as shown in FIG. 3, the semiconductor substrate 12 that has the body region 26 and the drift region 28 provided therein is prepared. Next, Al (p-type impurities) is implanted, by ion implantation, into a range of the front surface 72 of the semiconductor substrate 12 that corresponds to each of the guard ring regions 64. Here, the energy at which Al is implanted is set low, to thereby implant Al only into the shallow range in the periphery of the front surface 72 of the semiconductor substrate 12. As such, if the implantation depth of the ions is shallow, the implantation range thereof can be controlled with high accuracy.

Figure 4:
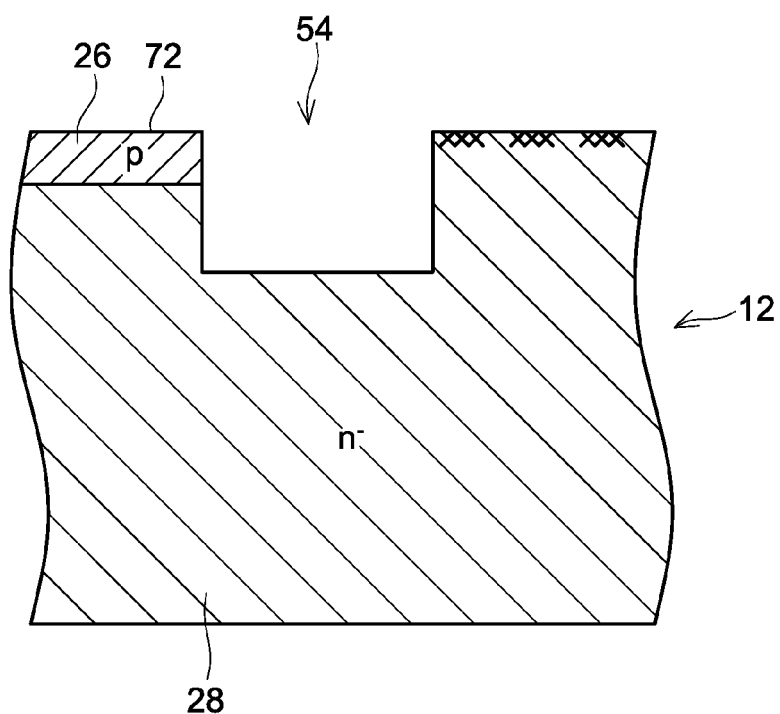
FIG. 4 is an explanatory diagram of a step for manufacturing the semiconductor device 10 in the first embodiment.

Next, as shown in FIG. 4, the front surface 72 of the semiconductor substrate 12 is selectively etched to thereby form the termination trench 54. The termination trench 54 is formed at a position adjacent to the body region 26.

Figure 5:
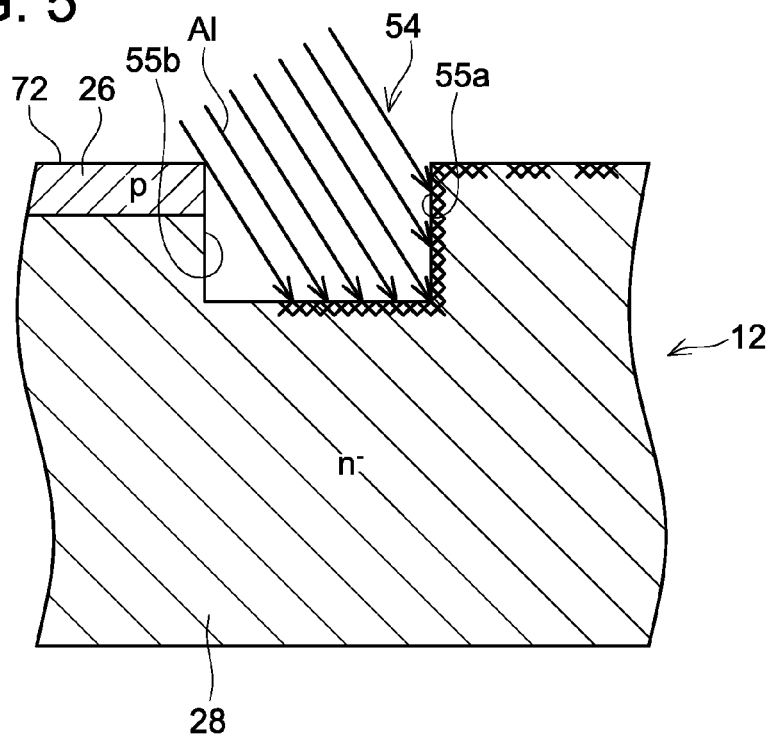
FIG. 5 is an explanatory diagram of a step for manufacturing the semiconductor device 10 in the first embodiment.

Next, as shown in FIG. 5, Al is implanted into the termination trench 54 by ion implantation. This ion implantation is performed with masking so as not to allow Al to be implanted into the front surface 72 and the lateral surface 55b of the termination trench 54 on the inner circumferential side. Here, a direction of the ion implantation is inclined to the front surface 72 of the semiconductor substrate 12, to thereby implant Al into the bottom surface and the lateral surface 55a on the outer circumferential side of the termination trench 54.

Figure 6:
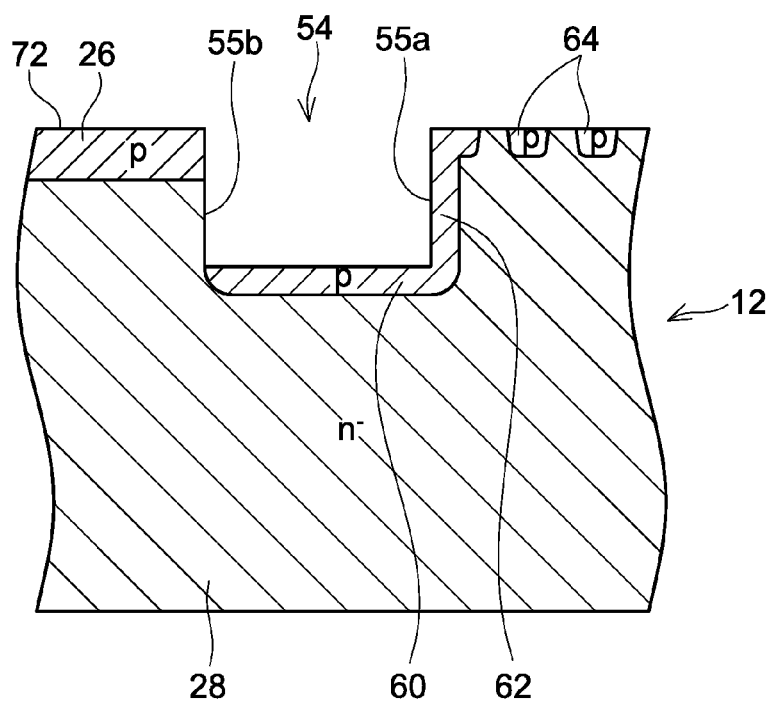
FIG. 6 is an explanatory diagram of a step for manufacturing the semiconductor device 10 in the first embodiment.

Next, the semiconductor substrate 12 is annealed to thereby activate the Al implanted into the semiconductor substrate 12. As shown in FIG. 6, the guard ring regions 64, the lower end p-type region 60, and the lateral p-type region 62 are thereby formed.

Next, as shown in FIG. 2, the insulating film 70 is formed on the front surface 72 and an inner surface of the termination trench 54. The termination trench 54 has a large width, and hence is not completely filled with the insulating film 70. In other words, the gap 70a is formed between a portion of the insulating film 70 covering the lateral surface 55b on the inner circumferential side and a portion of the insulating film 70 covering the lateral surface 55a on the outer circumferential side. The outer circumference region 50 is thereby completed. Notably, a material different from that of the insulating film 70 may be embedded in the gap 70a in a subsequent step.

As described above, in this manufacturing method, the lateral p-type region 62 is formed by the inclined ion implantation into the lateral surface 55a of the termination trench 54 on the outer circumferential side. By changing the depth of the ion implantation into the lateral surface 55a, a width of the lateral p-type region 62 (a dimension in a lateral direction of the semiconductor substrate 12 (the lateral direction in FIG. 2)) can be controlled. The depth of the ion implantation into the lateral surface 55a can be controlled with high accuracy, and hence according to this manufacturing method, the width of the lateral p-type region 62 can be controlled exactly. Accordingly, the lateral p-type region 62 that has a small width can be formed. Moreover, the lateral p-type region 62 is formed by the ion implantation of Al. Since Al has a small diffusion coefficient in SiC, a distance over which Al diffuses during the above-described annealing is short. By using Al as p-type impurities as such, it is possible to make the width of the lateral p-type region 62 smaller. As such, according to the above-described manufacturing method, the lateral p-type region 62 that has a small width can be formed with high accuracy.

Moreover, each of the guard ring regions 64 is formed by the ion implantation into the shallow range in the periphery of the front surface 72. In the ion implantation into the shallow range, the ion implantation range can be controlled exactly. Accordingly, the guard ring regions 64 each having a small width can be formed. Moreover, each of the guard ring regions 64 is formed by the ion implantation of Al. It is thereby possible to make the width of each of the guard ring regions 64 smaller. As such, according to the above-described method, the guard ring regions 64 each having a small width can be formed with high accuracy.

Moreover, the guard ring regions 64 and the lateral p-type region 62 can be formed with high accuracy as described above, and hence according to this method, a spacing between the lateral p-type region 62 and the guard ring region 64, and a spacing between every two of the guard ring regions 64 can be made narrow. According to this method, the depletion layer can therefore be ensured to reliably spread in the outer circumference region 50, and the high withstand voltage in the outer circumference region 50 can be realized. Moreover, according to this method, an area of the outer circumference region 50 can be decreased, which makes it possible to manufacture a small-sized semiconductor device 10.

Second Embodiment

Figure 7:
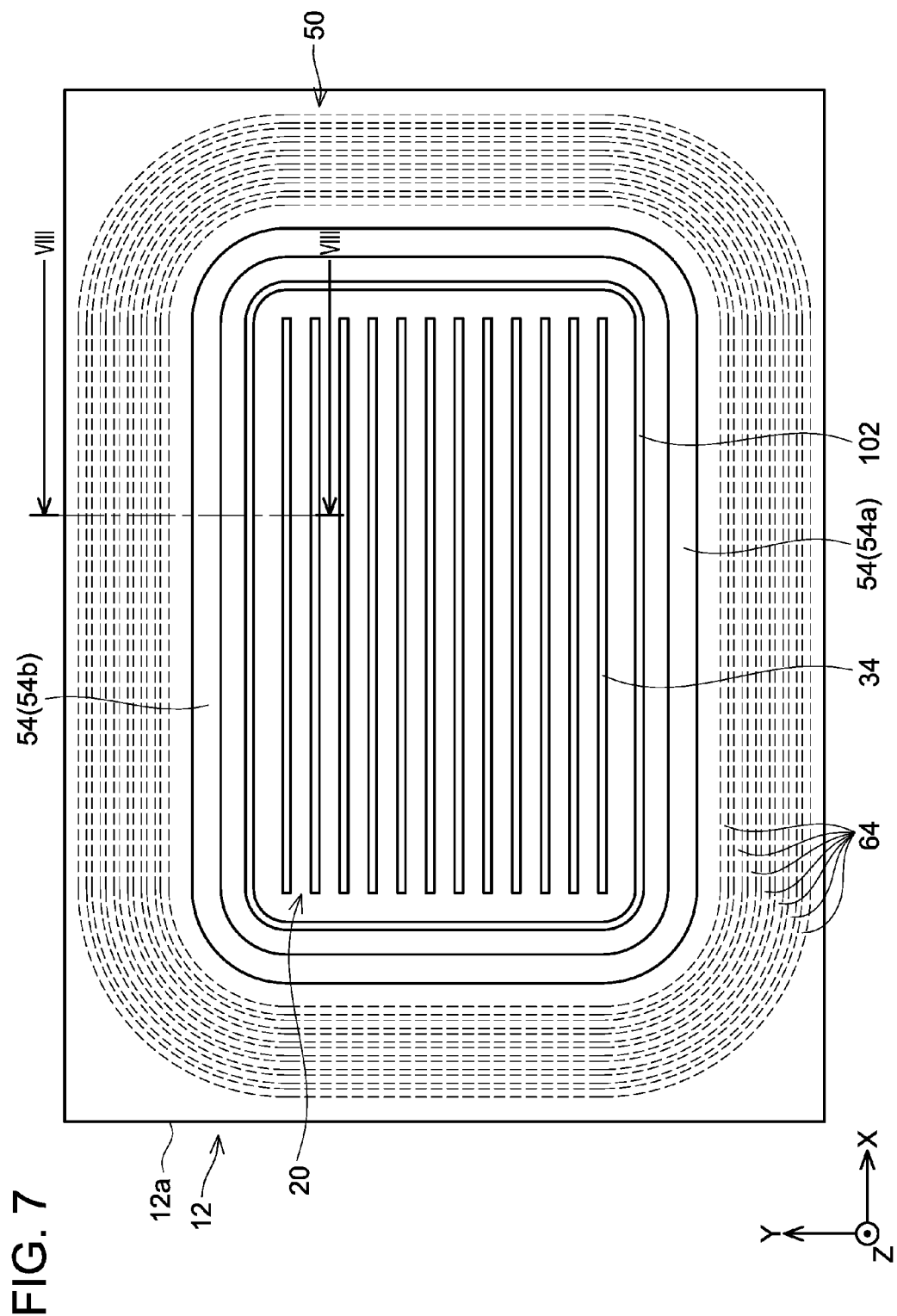
FIG. 7 is a plan view of a semiconductor device in a second embodiment.
Figure 8:
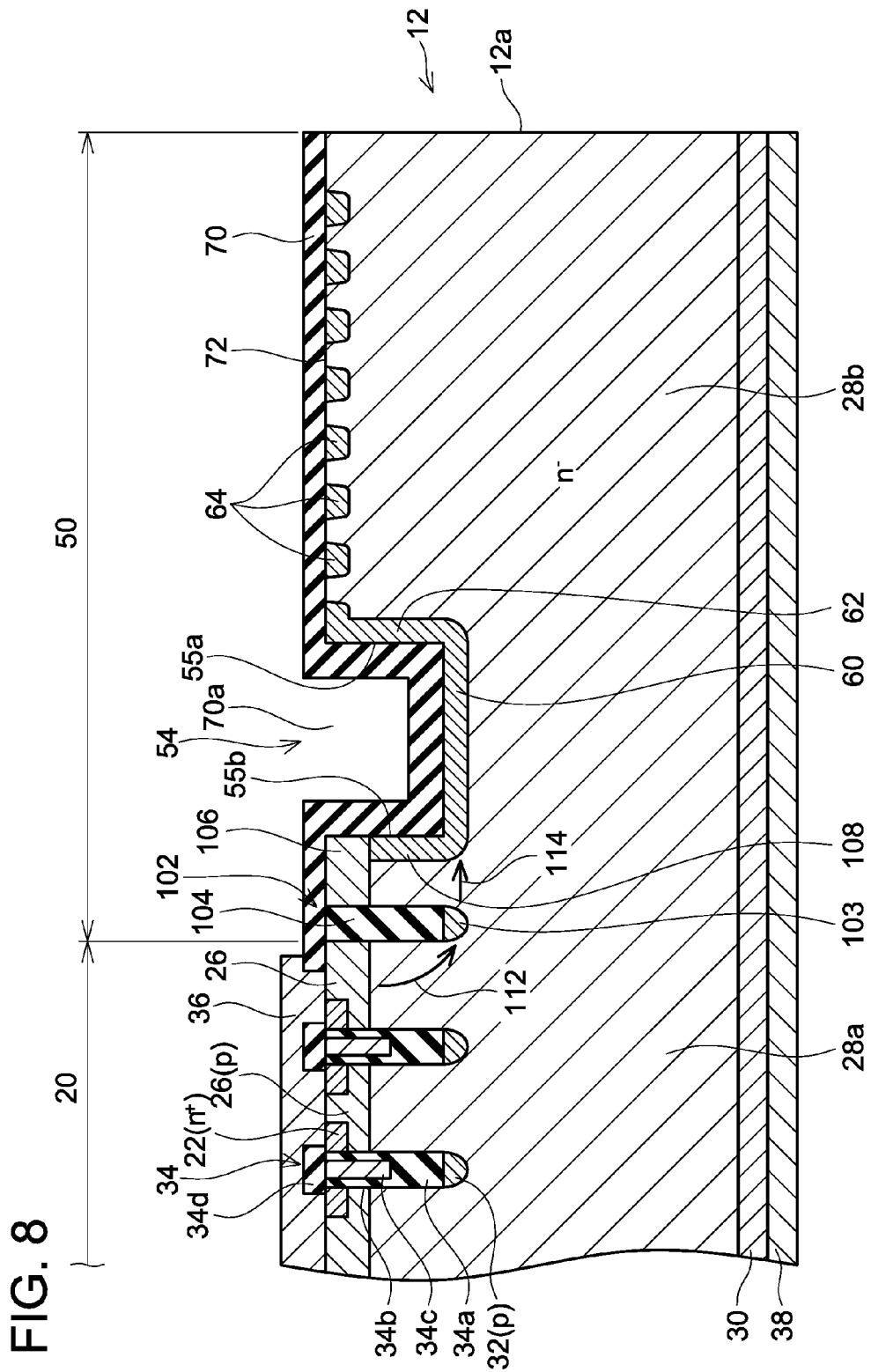
FIG. 8 is a vertical cross-sectional view taken along a line VIII-VIII in FIG. 7.

In a semiconductor device in a second embodiment shown in FIGS. 7 and 8, a separation trench 102 is provided in the front surface 72 between the body region 26 and the termination trench 54. Embedded in the separation trench 102 is an insulating layer 104. As shown in FIG. 7, the separation trench 102 is provided to surround the circumference of the MOSFET region 20. As shown in FIG. 8, provided at a position that is in contact with a lower end of the separation trench 102 is a p-type floating region 103. The p-type floating region 103 is provided to surround the circumference of the MOSFET region 20 along the separation trench 102. Provided on an outer circumferential side of the separation trench 102 is a p-type region 106. The p-type region 106 is provided in a range exposed on the front surface 72 of the semiconductor substrate 12. The front surface 72 of the p-type region 106 is covered with the insulating film 70. Accordingly, the p-type region 106 is not in contact with the source electrode 36. The separation trench 102 separates the p-type region 106 from the body region 26. Moreover, in the semiconductor device in the second embodiment, a lateral p-type region 108 is provided along the lateral surface 55b of the termination trench 54 on the inner circumferential side. The lateral p-type region 108 extends from the p-type region 106 to the lower end p-type region 60. The lateral p-type region 108 is connected to the p-type region 106, and connected to the lower end p-type region 60. The lateral p-type region 108 includes Al as p-type impurities. Other configurations in the semiconductor device in the second embodiment are equal to those in the semiconductor device in the first embodiment.

Next, there will be described how a depletion layer spreads in the outer circumference region 50 in the semiconductor device in the second embodiment. When the MOSFET is turned off, a depletion layer spreads from the pn junction at the boundary portion between the body region 26 and the drift region 28, and reaches the p-type floating region 103 on a lower side of the separation trench 102, as shown by an arrow 112 in FIG. 8. Consequently, as shown by an arrow 114, the depletion layer extends from the p-type floating region 103. This depletion layer reaches the lower end p-type region 60 or the lateral p-type region 108. Consequently, the depletion layer spreads from the entirety of each of the p-type region 106, the lateral p-type region 108, the lower end p-type region 60, and the lateral p-type region 62 into the drift region 28 around the circumference of the above-described p-type regions. Therefore, in the periphery of the front surface 72, the depletion layer spreads from the lateral p-type region 62 toward the guard ring region 64 on the innermost circumferential side. When the depletion layer reaches the guard ring region 64 on the innermost circumferential side, the depletion layer spreads from that guard ring region 64 to the guard ring region 64 next thereto. As such, the depletion layer spreads successively through each of the guard ring regions 64 to the outer circumferential side. The depletion layer therefore spreads widely in the outer circumference region 50. The high withstand voltage in the outer circumference region 50 is thereby realized.

Figure 9:
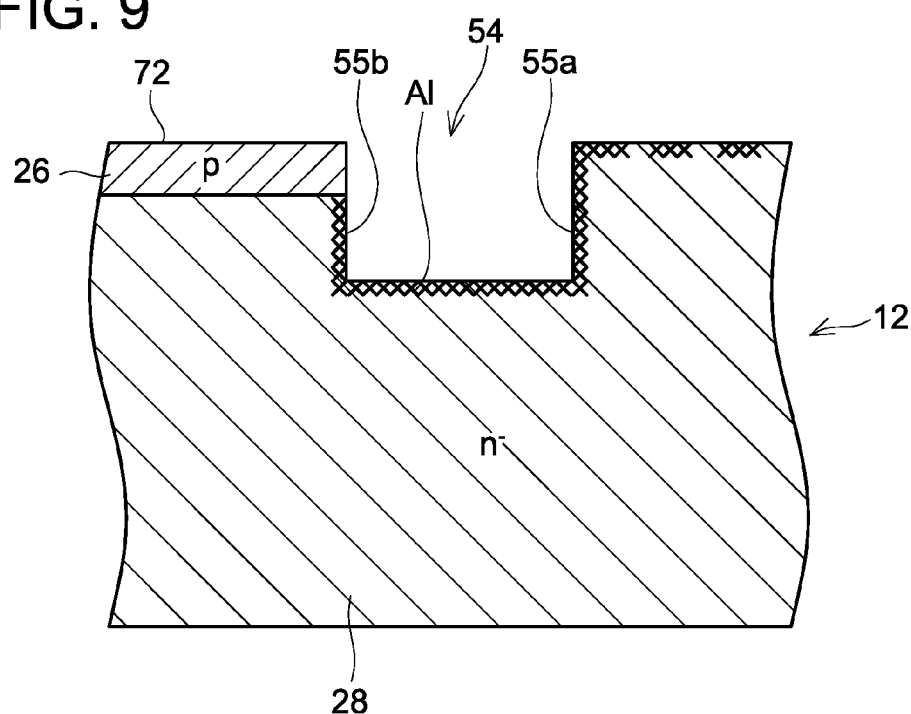
FIG. 9 is an explanatory diagram of a step for manufacturing the semiconductor device in the second embodiment.

Next, a method for manufacturing the semiconductor device in the second embodiment (a step for forming the outer circumference region 50) will be described. Initially, as shown in FIG. 4, the semiconductor substrate 12 is processed as with the first embodiment. Next, by the inclined ion implantation as with the first embodiment, Al is implanted into the termination trench 54. It should be noted in the second embodiment that masking is not applied to the lateral surface 55b of the termination trench 54 on the inner circumferential side in the inclined ion implantation. Therefore, when Al is implanted into the lateral surface 55a on the outer circumferential side of a termination trench 54a which is shown on a lower side in FIG. 7, Al is also implanted into the lateral surface 55b on the inner circumferential side of a termination trench 54b which is shown on an upper side in FIG. 7. Further, when Al is implanted into the lateral surface 55a on the outer circumferential side of the termination trench 54b which is shown on the upper side in FIG. 7, Al is also implanted into the lateral surface 55b on the inner circumferential side of the termination trench 54a which is shown on the lower side in FIG. 7. As shown in FIG. 9, Al is therefore implanted into the lateral surfaces of the termination trench 54 on both sides in the second embodiment.

Figure 10:
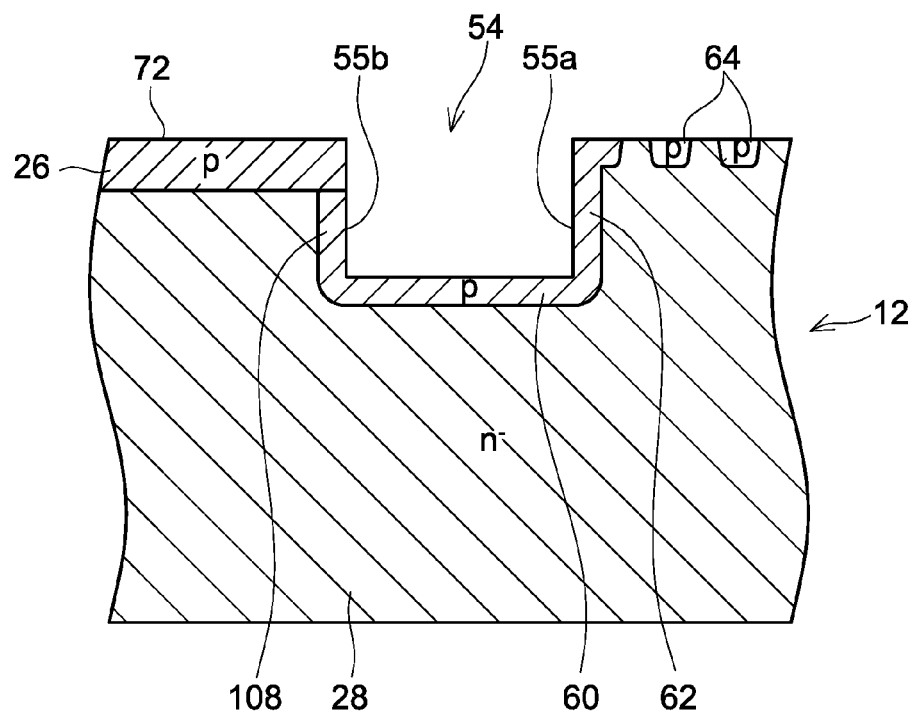
FIG. 10 is an explanatory diagram of a step for manufacturing the semiconductor device in the second embodiment.

Next, the semiconductor substrate 12 is annealed to thereby activate the Al thus implanted into the semiconductor substrate 12. As shown in FIG. 10, the guard ring regions 64, the lateral p-type region 108, the lower end p-type region 60, and the lateral p-type region 62 are thereby formed. In other words, in the second embodiment, Al is implanted into the lateral surface 55b of the termination trench 54 on the inner circumferential side, and hence the lateral p-type region 108 is formed along that lateral surface 55*b* on the inner circumferential side.

Figure 11:
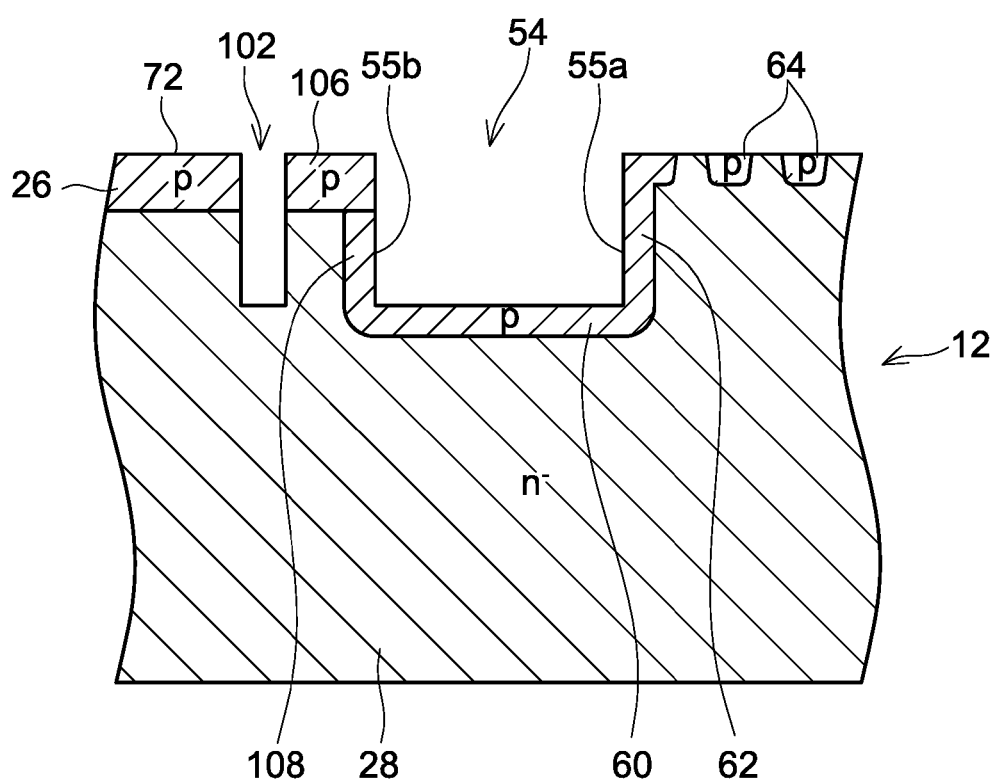
FIG. 11 is an explanatory diagram of a step for manufacturing the semiconductor device in the second embodiment.

Next, as shown in FIG. 11, the front surface 72 of the semiconductor substrate 12 is selectively etched to thereby form the separation trench 102 in the front surface 72 on the inner circumferential side with respect to the termination trench 54. The p-type region 106 adjacent to the termination trench 54 is thereby separated from the body region 26. Next, by the ion implantation into a bottom surface of the separation trench 102, the p-type floating region 103 is formed. Next, the insulating layer 104 is formed in the separation trench 102. Next, the insulating film 70 is formed on the front surface 72 and the inner surface of the termination trench 54. The insulating film 70 is formed to cover the entirety of a front surface of the p-type region 106. This prevents the p-type region 106 from being in contact with the source electrode 36 subsequently formed. By the steps above, the outer circumference region 50 shown in FIG. 8 is completed.

As described above, in the second embodiment, Al is also implanted into the lateral surface 55*b* of the termination trench 54*b* on the inner circumferential side, and hence the p-type region 106 and the lower end p-type region 60 are connected by the lateral p-type region 108. Accordingly, to separate these p-type regions from the body region 26, the separation trench 102 is formed. Moreover, the p-type floating region 103 is formed at a position that is in contact with the lower end of the separation trench 102, thereby causing the depletion layer to easily spread in the outer circumference region 50.

Third Embodiment

Figure 12:
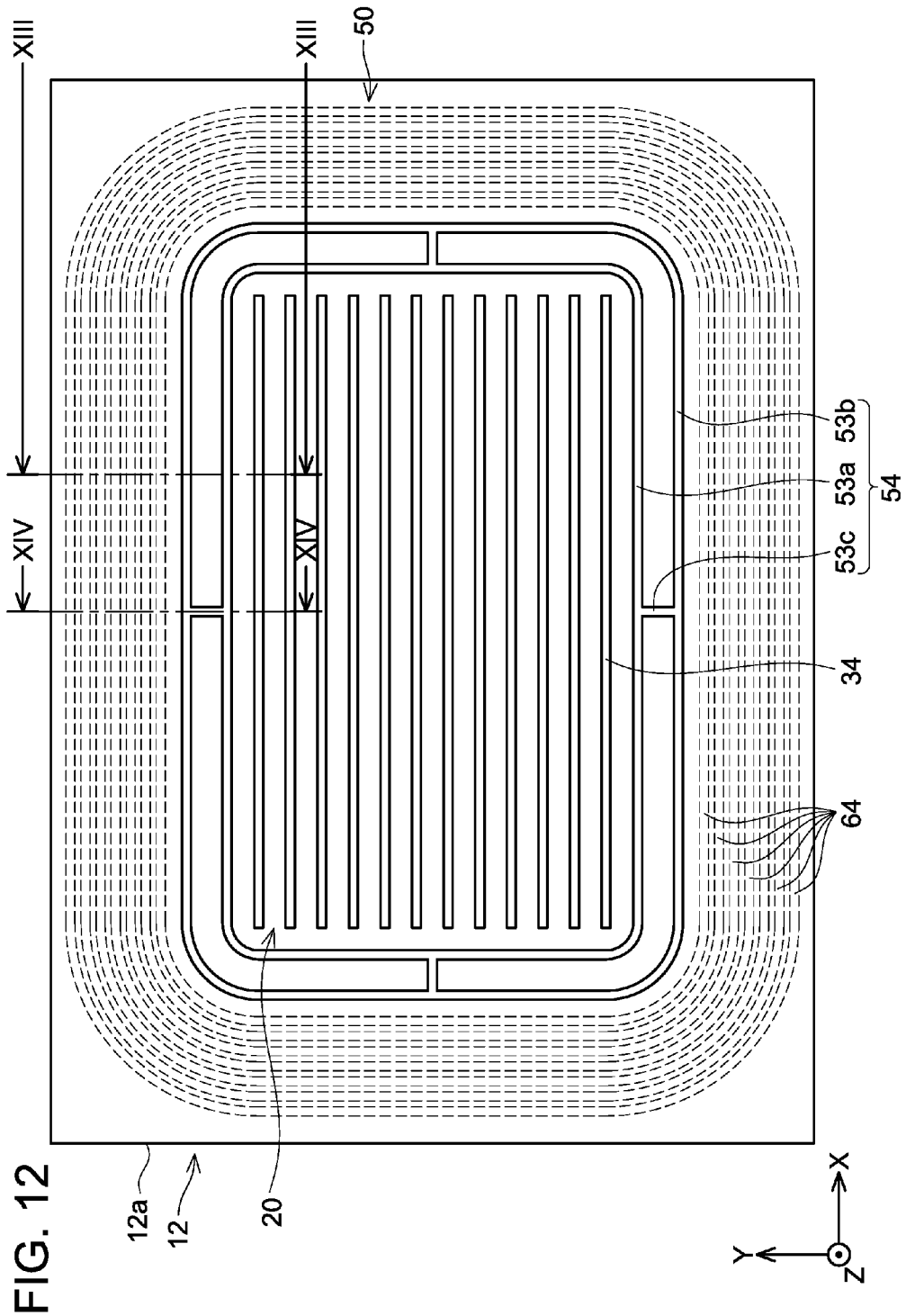
FIG. 12 is a plan view of a semiconductor device in a third embodiment.
Figure 13:
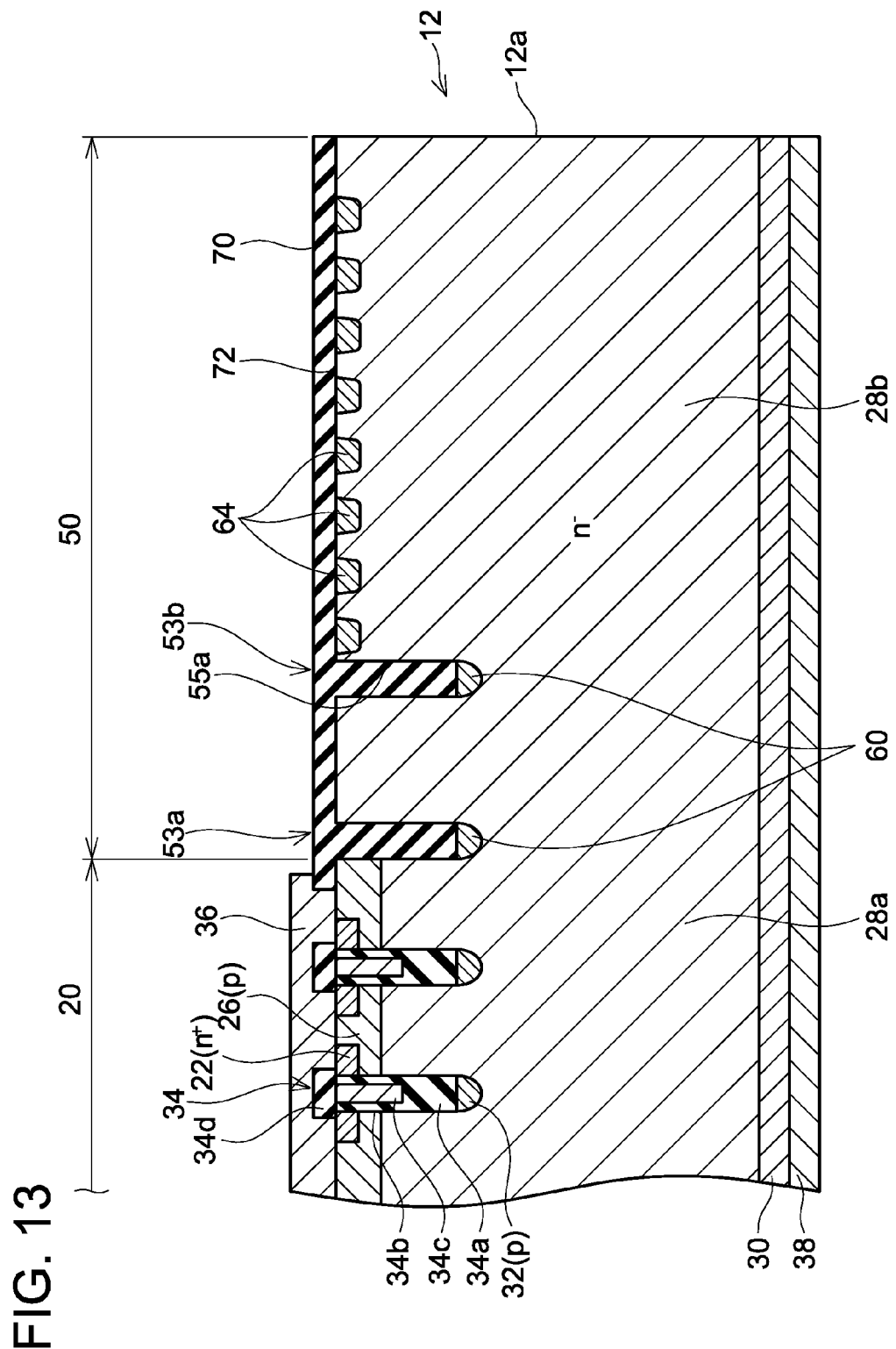
FIG. 13 is a vertical cross-sectional view taken along a line XIII-XIII in FIG.
Figure 14:
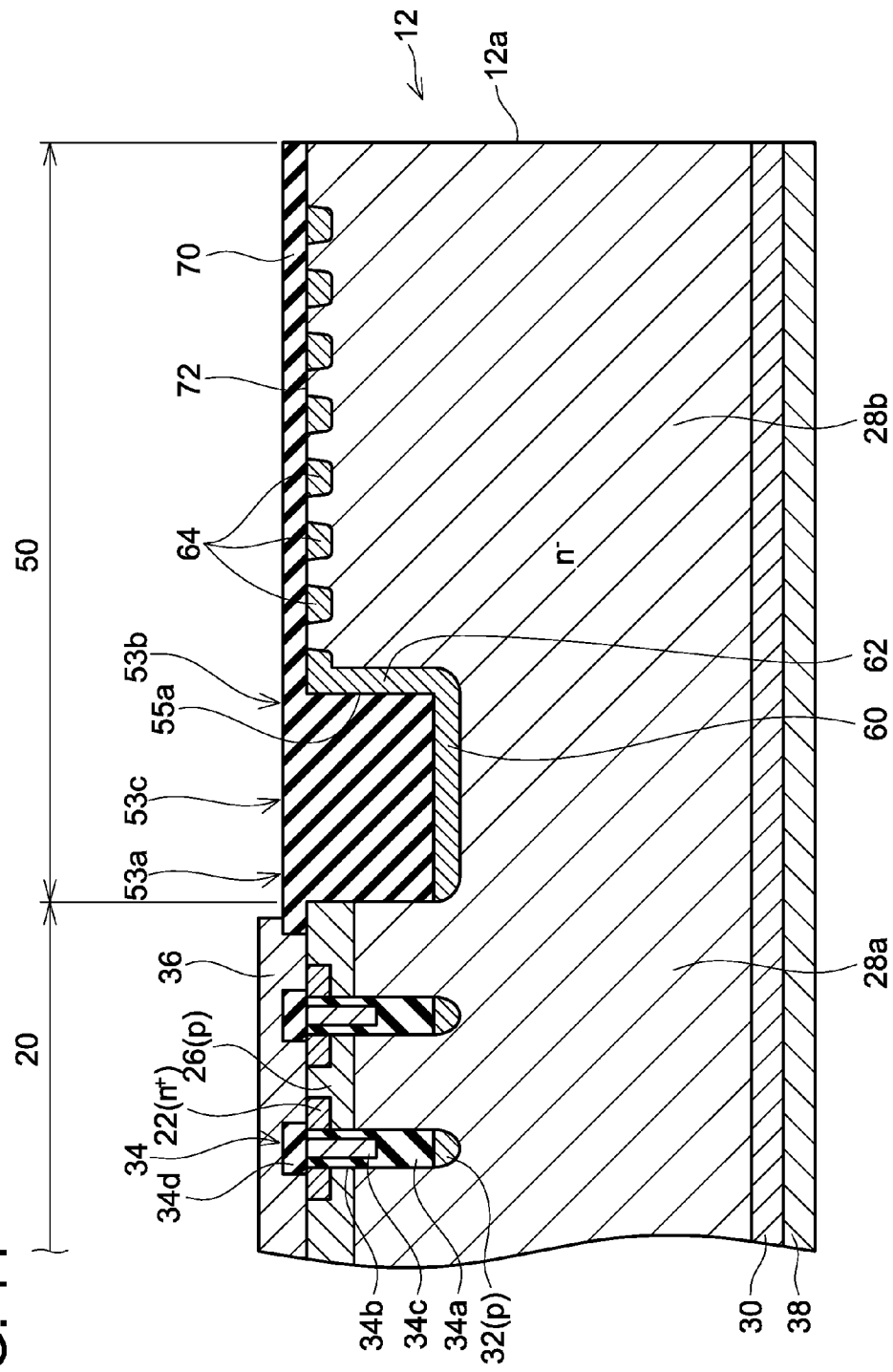
FIG. 14 is a vertical cross-sectional view taken along a line XIV-XIV in FIG. 12.

In a semiconductor device in a third embodiment shown in FIGS. 12 to 14, the termination trench 54 is configured with a first trench 53*a*, a second trench 53*b*, and third trenches 53*c*. As shown in FIG. 12, the first trench 53*a* extends to surround the circumference of the MOSFET region 20. The second trench 53*b* is provided in the front surface 72 on the outer circumferential side with respect to the first trench 53*a*, and extends to surround the circumference of the first trench 53*a*. A plurality of the third trenches 53*c* are provided in the front surface 72 between the first and second trenches 53*a* and 53*b*. Each of the third trenches 53*c* extends from the inner circumferential side toward the outer circumferential side. One end of the third trench 53*c* is connected to the first trench 53*a*, while the other end of the third trench 53*c* is connected to the second trench 53*b*. As shown in FIGS. 13 and 14, the trenches 53*a* to 53*c* have approximately the same depth. The lower end p-type region 60 is provided at a position that is in contact with lower ends of the trenches 53*a* to 53*c*. The lower end p-type region 60 is provided along the trenches 53*a* to 53*c*. Moreover, the lateral p-type region 62 is provided in a range that is in contact with the lateral surface 55*a* of the second trench 53*b* on the outer circumferential side. It should be noted that the lateral p-type region 62 is only provided at the lateral surface 55*a* of the second trench 53*b* on the outer circumferential side, at connecting portions of the second and third trenches 53*b* and 53*c*, and not provided at other positions of the second trench 53*b*. Other configurations in the semiconductor device in the third embodiment are equal to those in the semiconductor device in the first embodiment.

In the cross-section in FIG. 14, the semiconductor device in the third embodiment has the same structure as that of the semiconductor device in the first embodiment shown in FIG. 2. Accordingly, as with the first embodiment, the depletion layer spreads in the outer circumference region 50. Moreover, although the semiconductor device in the third embodiment differs from the semiconductor device in the first embodiment in shape of the termination trench 54, it can be manufactured by the steps similar to those in the first embodiment. In the ion implantation (the Al implantation) into the lateral p-type region 62, as shown in FIG. 14, since the width of the termination trench 54 (the dimension in the lateral direction in FIG. 14) is large in portions where the third trenches 53*c* are provided, Al is implanted into the lateral surface 55*a* of the second trench 53*b* on the outer circumferential side. On the other hand, as shown in FIG. 13, since the width of each of the first and second trenches 53*a* and 53*b* (the dimension in the lateral direction in FIG. 13) is small in portions where the third trenches 53*c* are not provided, almost no Al is implanted into the lateral surface of each of the first and second trenches 53*a* and 53*b* on the outer circumferential side. Accordingly, the lateral p-type region 62 is provided only at the connecting portions of the second and third trenches 53*b* and 53*c*.

The first to third embodiments have been described above. Notably, although the semiconductor device that has a MOSFET has been described in the first to third embodiments, other elements such as an IGBT and the like may be provided in place of the MOSFET. Moreover, although the semiconductor substrate 12 is constituted of SiC in the above-mentioned embodiments, a semiconductor substrate constituted of other materials such as Si may be used. Moreover, in place of the p-type floating regions 32 and 103 in the above-mentioned embodiments, a p-type region connected to a prescribed potential may be provided.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device, comprising:
   a semiconductor substrate;
   a front electrode provided on a front surface of the semiconductor substrate; and
   a rear electrode provided on a rear surface of the semiconductor substrate,
   wherein
   the semiconductor device is configured to switch a conducting path between the front electrode and the rear electrode,
   the semiconductor substrate comprises:
   a first region of an n-type being in contact with the front electrode;
   a second region of a p-type being in contact with the front electrode and the first region;
   a third region of the n-type provided on a lower side of the second region and separated from the first region by the second region;
   a gate trench provided in the front surface and penetrating the first region and the second region so as to reach the third region;

a fourth region of the p-type being in contact with a lower end of the gate trench;
a termination trench provided in the front surface in a range outside the second region;
a lower end p-type region of the p-type being in contact with a lower end of the termination trench;
a lateral p-type region of the p-type being in contact with a lateral surface of the termination trench on an outer circumferential side, connected to the lower end p-type region, and exposed on the front surface;
a plurality of guard ring regions of the p-type provided on the outer circumferential side with respect to the lateral p-type region and exposed on the front surface;
an outer circumference n-type region of the n-type provided on the outer circumferential side with respect to the termination trench, connected to the third region, separating the lateral p-type region from the guard ring regions, and separating the guard ring regions from one another;
a separation trench provided in the front surface of the semiconductor substrate between the second region and the termination trench;
a fifth region of the p-type being in contact with a lower end of the separation trench; and
a sixth region of the p-type provided between the termination trench and the separation trench, being in contact with a lateral surface of the termination trench on an inner circumference side, connected to the lower end p-type region, and exposed on the front surface of the semiconductor substrate,
wherein the separation trench separates the second region from the sixth region.

2. The semiconductor device of claim 1, wherein a width of the termination trench is wider than a width of the gate trench.

3. The semiconductor device of claim 1, wherein the lower end p-type region and the lateral p-type region include Al.

4. The semiconductor device of claim 1, wherein
the termination trench comprises:
a first trench;
a second trench provided on the outer circumference side with respect to the first trench; and
a third trench connecting the first trench and the second trench,
the lateral p-type region is in contact with a lateral surface of the second trench on the outer circumference side, and
the lower end p-type region is in contact with lower ends of the first, second, and third trenches.

5. The semiconductor device of claim 1, further comprising an insulating film covering a lateral surface on an inner circumference side, a bottom surface, and the lateral surface on the outer circumference side of the termination trench, wherein a region in which the insulating film is not provided is provided between a portion of the insulating film covering the lateral surface on the inner circumference side and a portion of the insulating film covering the lateral surface on the outer circumference side.

6. A method for manufacturing a semiconductor device, the semiconductor device comprising:
a semiconductor substrate;
a front electrode provided on a front surface of the semiconductor substrate; and
a rear electrode provided on a rear surface of the semiconductor substrate,
wherein
the semiconductor device is configured to switch a conducting path between the front electrode and the rear electrode,
the semiconductor substrate comprises:
a first region of an n-type being in contact with the front electrode;
a second region of a p-type being in contact with the front electrode and the first region;
a third region of the n-type provided on a lower side of the second region and separated from the first region by the second region;
a gate trench provided in the front surface and penetrating the first region and the second region so as to reach the third region;
a fourth region of the p-type being in contact with a lower end of the gate trench;
a termination trench provided in the front surface in a range outside the second region;
a lower end p-type region of the p-type being in contact with a lower end of the termination trench;
a lateral p-type region of the p-type being in contact with a lateral surface of the termination trench on an outer circumferential side, connected to the lower end p-type region, and exposed on the front surface;
a plurality of guard ring regions of the p-type provided on the outer circumferential side with respect to the lateral p-type region and exposed on the front surface; and
an outer circumference n-type region of the n-type provided on the outer circumferential side with respect to the termination trench, connected to the third region, separating the lateral p-type region from the guard ring regions, and separating the guard ring regions from one another, the method comprising:
forming the termination trench in the semiconductor substrate; and
forming the lower end p-type region and the lateral p-type region by implanting p-type impurities into the lateral surface and a bottom surface of the termination trench along a direction inclined to the front surface of the semiconductor substrate.

* * * * *